(12) United States Patent
Weinert

(10) Patent No.: US 6,270,840 B1
(45) Date of Patent: Aug. 7, 2001

(54) APPARATUS AND METHOD FOR PRODUCING PLANE-PARALLEL FLAKES

(75) Inventor: Hilmar H. Weinert, Kaufbeuren (DE)

(73) Assignee: Weinert Vakuum Verfahrenstechnik GmbH (DE)

( * ) Notice: Subject to any disclaimer, the term of this patent is extended or adjusted under 35 U.S.C. 154(b) by 0 days.

(21) Appl. No.: 09/390,297

(22) Filed: Sep. 3, 1999

(30) Foreign Application Priority Data

Sep. 28, 1998 (DE) ............................................. 198 44 357

(51) Int. Cl.⁷ ............................. C23C 14/00; B05D 3/10; B05D 1/36
(52) U.S. Cl. .................. 427/251; 427/248.1; 427/255.5; 427/255.7; 427/294; 427/350; 427/336; 427/337; 427/402
(58) Field of Search ................................ 427/248.1, 251, 427/255.11, 255.5, 294, 350, 336, 337, 352, 353, 402, 255.7

(56) References Cited

U.S. PATENT DOCUMENTS

| 3,123,489 | 3/1964 | Bolomey et al. | 106/291 |
|---|---|---|---|
| 3,123,490 | 3/1964 | Bolomey et al. | 106/291 |
| 3,374,105 | 3/1968 | Bolomey | 106/291 |
| 4,113,815 | * 9/1978 | Kawamura | 264/101 |
| 4,168,986 | * 9/1979 | Venis, Jr. | 106/291 |

(List continued on next page.)

FOREIGN PATENT DOCUMENTS

| 27 47 061 | 4/1979 | (DE) . |
|---|---|---|
| 40 20 999 | 1/1992 | (DE) . |
| 42 21 800 | 11/1992 | (DE) . |
| 43 38 907 | 5/1995 | (DE) . |
| 227423 | * 7/1987 | (EP) . |
| 0 227 423 | 6/1992 | (EP) . |
| 0 337 369 | 10/1993 | (EP) . |
| 1507784 | 12/1967 | (FR) . |
| 2 072 095 | 9/1981 | (GB) . |

OTHER PUBLICATIONS

Raimund Schmid et al., "Luster Pigments with Optically Variable Properties", European Coatings Net: Sneak Preview, http://www.coatings.de/articles/schmid.htm, Apr. 1997.
Rueters Limited, BASF to Defend Self in Patent Suit, http://www.derwent.com/news/20080001rns00061.htm, Aug. 18, 1997.

*Primary Examiner*—Shrive P. Beck
*Assistant Examiner*—Michael Barr
(74) *Attorney, Agent, or Firm*—George H. Gerstman; Seyfarth Shaw

(57) ABSTRACT

An apparatus and method technique for producing plane-parallel flakes is disclosed. In a preferred embodiment, the present invention is realized through a multi-chamber apparatus for producing plane-parallel flakes from layers vapor deposited in vacuum on an endlessly circulating substrate. The present invention includes the sequential steps of: vapor deposition of a separating agent layer in high vacuum on the endlessly circulating substrate; vapor deposition of one or more layers of metal, oxides, fluorides, and nitrides in high vacuum on the separating agent layer; and stripping the vapor deposited layers from the endlessly circulating substrate under low vacuum. The vapor deposited layers are subsequently present in a separate vacuum stage separated from the vapor deposition chamber by dynamic locks as a suspension of fine flakes in a mixture of solvent. and separating agent. The suspension may continuously or intermittently be transferred out of the separate vacuum stage for further processing. The solvent may be water in a vacuum environment of more than 20 mbar or secondary or tertiary alcohols at more than 0.05 mbar.

18 Claims, 4 Drawing Sheets

U.S. PATENT DOCUMENTS

| | | | |
|---|---|---|---|
| 4,434,010 | 2/1984 | Ash | 106/291 |
| 4,526,131 | 7/1985 | Shirahata et al. | 118/718 |
| 4,752,315 * | 6/1988 | Nagasaki et al. | 65/141 |
| 5,156,720 | 10/1992 | Rosenfeld et al. | 205/76 |
| 5,278,590 | 1/1994 | Phillips et al. | 359/589 |
| 5,401,306 | 3/1995 | Schmid et al. | 106/417 |
| 5,635,008 | 6/1997 | Bianchi et al. | 156/247 |
| 5,658,976 * | 8/1997 | Carpenter et al. | 524/403 |
| 5,952,050 * | 9/1999 | Doan | 427/336 |

* cited by examiner

| Location | Vacuum | Suction capacity required for overcoming lock flow | Type of vacuum pumps |
|---|---|---|---|
| Vapor deposition part (2) | $10^{-4}$ mbar molecular flow | 5400 l/sec. | Diffusion pumps + mech. pumps arranged downstream |
| Lock (6a) | 0.2 mbar laminar flow | 11,700 m³/h | Rotary piston blower + mech. pumps |
| Lock (6b) | 10 mbar laminar flow | 1380 m³/h | mechanical pumps |
| Chamber part (7) | 50 mbar | 100 m³/h, for evacuating air dissolved in the water, water vapor at condenser only | mechanical pumps+water-cooled condenser |

Figure 2

| Product | Application |
|---|---|
| Al | Metallic pigment for automobile body paints, printing inks |
| $SiO_2$ - Al - $SiO_2$ | Applications as above, including a chemical corrosion protection layer |
| Ag | as a conductive lacquer for bonding |
| Ag - Cu - Ag | as a low-cost conductive lacquer |
| Ti (> 2 μm thickness) | Iridescent product, subsequently oxidised at 300°C in air |
| Ti silicide - Al - Ti silicide | Bronze or gold colored particles |
| Noble metals | Catalysts |
| 3-component multiple layers | Microwave absorbers |

Figure 4

APPARATUS AND METHOD FOR PRODUCING PLANE-PARALLEL FLAKES

CROSS-REFERENCE TO RELATED APPLICATIONS

This patent application claims priority to German Patent Application No. 19844357.9, filed Sep. 28, 1998, which is hereby incorporated by reference herein in its entirety.

FIELD OF THE INVENTION

The present invention relates generally to plane-parallel flakes and, more particularly, to an apparatus and method for producing plane-parallel flakes.

BACKGROUND OF THE INVENTION

In the past few years there has been an increased interest in using plane-parallel flakes as pigments in paints and printing inks, as a catalyst material, as a starting product for magnetic and electric screens, and as a starting material for conductive lacquers. In contrast with the classical pigments produced in accordance with a grinding process and having a more or less spherical shape, plane-parallel flakes are characterized by an improved brilliance and by the fact that their quantity required in a paint as a pigment is substantially smaller. Thus, for example, aluminum flakes produced in accordance with a physical vapor deposition (PVD) process typically have a thickness of 30–500 nm; their superficial dimensions ranging between 5 and 50 microns. Even 3–4 layers of such aluminum flakes produce an optically opaque layer at quantities of no more than 0.3 to 0.4 $g/m^2$.

Plane-parallel flakes have heretofore been produced, in accordance with the prior art, through a costly, intermittent three-stage process. The high costs of this process and the low production quantities do not allow for use in mass-produced articles such as in metallic paintcoats or printer's inks.

One example for production according to an intermittent. multi-stage process is the production of optically variable pigment flakes used to enhanced safety against forgery oil banknotes such as disclosed in EP 227423. Similar products and processes are disclosed in U.S. Pat. No. 5,278,590.

A process disclosed in U.S. Pat. No. 4,434,010 does not involve use of separating agents. Vapor deposition is instead performed directly onto a plastic film which is subsequently comminuted and dissolved completely in a suitable solvent. As a result, the vapor deposition layer dissociated into particles remains as a suspension.

In all of the above-represented cases, large amounts of solvents are required for washing out the product. These must either be reprocessed or disposed of.

In summary, it may therefore be noted with respect to the prior art that in all of the known PVD processes for producing plane-parallel flakes, with the exception of U.S. Pat. No. 4,434,010, the following stages are passed through:

(1) application of a separating lacquer on a polyester film substrate by printing and drying, with this process being performed on classical rotary gravure printing machines for coiled material in an atmosphere under explosion protection conditions;

(2) sequential vapor deposition of the layers under high vacuum, partly through several reciprocating passages of the film substrate in the vacuum unit, and removal of the vapor coated roll; and (3) removing the composite product by dissolving the separating lacquer in a solvent (acetone, ethyl acetate), and filtering out the product from the solvent, for which purpose scraping and brushing means are used in a solvent bath through which the web of film passes, with the product subsequently being filtered out and proceeding towards further processing.

The use of inorganic separating agents vapor deposited in a vacuum is described, for different applications, by Rosenfeld in U.S. Pat. No. 5,156,720. In this process, as well, a film substrate preferably comprised of polyester film is used, with this film substrate being usable only once owing to the high strain caused by the process. As one square meter of aluminum flakes having a thickness of 30 nm and a mass of 0.091 g is produced from one square meter of film having a, weight of 16.8 g by using a separating agent in a quantity of approx. 6 $g/m^2$ in manufacture, the yield by weight is merely 1/272 of used film and separating lacquer. This method is therefore uneconomical. Ratios are somewhat more favorable when using a vapor deposited separating agent with approx. 0.1 $g/m^2$, however the ratio still is only 1/180. In each case, this is an intermittent process which must be carried out consecutively on 2 or 3 different machines. The production costs are correspondingly high and hitherto thwarted a wider use of the product. Particular vapor deposition or sputtering materials may not even be applied on a film substrate as their thermal resistance is too low.

A vacuum coating machine for the production of oxide layers, which are preferably made of silicon monoxide, on temperature-sensitive plastic films, such as polyethylene and polypropylene, is disclosed in DE 4221800 A1. The purpose of this machine is to increase the barrier properties of the base film for oxygen, water vapor, and aroma substances. The characteristics of web path, evaporation zone, and array of thermal treatment steps allow for the production of oxide layers which are substantially free of micro cracks. This machine allows for the continuous removal of excess condensate, which allows the coating process to operate without the need to shield the rims of the film against, coatings. However, the removal is accomplished by spalling when the belt passes over a deflection roller, or by scraping or brushing the excess condensate.

A system of a closed loop belt to remove waste metal coatings which deposit right and left of a traveling web, or in areas near a melting process under vacuum, is disclosed in French Patent No. 1,507,784. During a melting process under vacuum, splashes and deposits from metal vapor take place. This system allows for the removal of those deposits before a certain build-up thickness has been reached. However, this system is largely inapplicable to the production of plane-parallel flakes.

In view of the foregoing, it would be desirable to provide a technique for producing plane-parallel flakes which overcomes the above-described inadequacies and shortcomings. More particularly, it would be desirable to provide a technique for producing plane-parallel flakes in an efficient and cost effective manner.

OBJECTS OF THE INVENTION

The primary object of the present invention is to provide an apparatus and method for producing plane-parallel flakes wherein production costs are reduced, a longer service life and a higher product output of any apparatus used are ensured, and increased safety requirements are taken into account.

The above-stated primary object, as well as other objects, features, and advantages, of the present invention will become readily apparent to those of ordinary skill in the art from the following detailed description which is to be read in conjunction with the appended drawings. While the present invention is described below with reference to preferred embodiment(s), it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could, be of significant utility.

SUMMARY OF THE INVENTION

According to the present invention, an apparatus and method for producing plane-parallel flakes is provided. In a preferred embodiment, the present invention apparatus is realized as a belt-type vapor deposition apparatus comprising a vapor deposition chamber having first and second evaporation means for applying a separating agent layer and at least one additional layer on an endless substrate. The belt-type vapor deposition apparatus also comprises a stripping chamber wherein the separating agent layer and the at least one additional layer are stripped from the substrate with the aid of stripping means in such a manner that the separating agent layer is present in a dissolved state, and the at least one additional layer is present in the form of plane-parallel flakes. The pressure in the stripping chamber is higher than in the vapor deposition chamber and lower than atmospheric pressure. As a result, production costs of plane-parallel flakes are reduced by a continuous process, a high product output is provided, the service life of apparatus components is long due to uniform mechanical strain, and safety standards are met.

In accordance with other aspects of the present invention, the at least one additional layer may in one embodiment be metal and another vaporisable substance, wherebr a paint having good covering properties is obtainable at small quantities of material used.

In accordance with further aspects of the present invention, capacity may be further increased if two layers separated by a separating agent are produced by the second evaporation means.

In accordance with still further aspects of the present invention, in a preferred manner, a water-soluble substance that is vaporisable in high vacuum without decomposition and which is selected from the group consisting of chlorides, fluorides and borates is employed as the separating agent, so that non-flammable substances may be used as solvents, and only small material quantities are required owing to the layer thickness which may be adjusted to be very low. Using water as a solvent improves the safety of the overall apparatus. However, with secondary and tertiary alcohol as a solvent, the vacuum conditions in the vacuum chamber may be devised to be more favorable.

In accordance with still further aspects of the present; invention, the substrate may be fabricated of a stainless steel alloy, nickel, or a metal comprising an electrodeposit, or an organic protective coating. This results in good thermal resistance and high mechanical resistance of the substrate. As an alternative, polyimide film is also suitable as a substrate owing to its good thermal and mechanical properties. With respect to properties and costs, substrate thicknesses of 20 to 2000 $\mu$m are preferred.

In accordance with still further aspects of the present invention, in the preferred embodiment, dynamically pumped. locks can be arranged between the vapor deposition and. stripping chambers, whereby optimum adjustment of the process conditions in the chambers separate from each other is possible.

In a preferred manner, the present invention method is realized by depositing a separating agent and at least one additional layer on a substrate and then treating the layers in a suspension in such a manner that the at least one additional layer is present in the form of plane-parallel flakes. The pressure during formation of the suspension is lower than atmospheric pressure, but higher than the pressure in the deposition step. Thus, an effective process for continuous production of plane-parallel flakes with a long service life and high product output is furnished.

In accordance with other aspects of the present invention, the at least one additional layer may be present in the form of a first layer, a separating agent layer and a subsequent second layer, whereby high efficiency may be achieved in manufacturing plane-parallel flakes.

In accordance with further aspects of the present invention, the overall process may take place dust-free in an encapsulated apparatus at a high degree of cleanness, without having to provide for a costly clean-room environment.

In accordance with still further aspects of the present invention, it may be stated that the thermal resistance of the substrate upon vapor deposition of multiple layers is increased, the use of flammable solvents in applying a separating agent and in stripping the product from the substrate is largely avoided, the separating agent fulfills its function even at a very small layer thickness and is easily applicable on the substrate and removable therefrom, and the substrate can provide a very long service life while having sufficient thermal and mechanical resistance.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

FIG. 2 is a table showing vacuum conditions and pump sizes and types for a specific embodiment of the apparatus shown in FIG. 1.

FIG. 4 is a table showing examples of a wide variety of plane-parallel flakes and combinations thereof, as well as some typical applications therefor, which may be produced using the apparatus shown in FIG. 1 in accordance with the present invention.

DETAILED DESCRIPTION OF PREFERRED EMBODIMENT(S)

Figure 1:
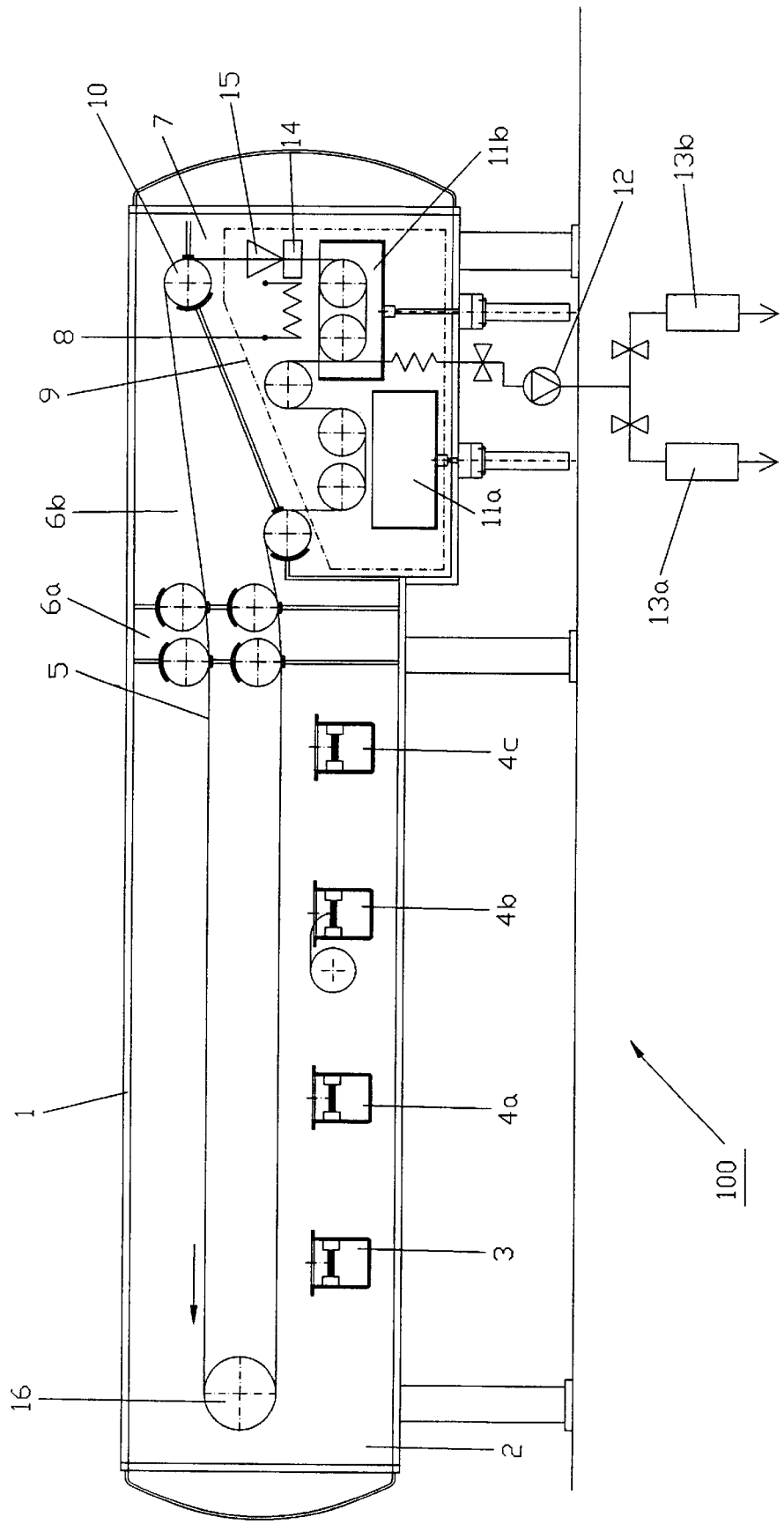
FIG. 1 shows a vapor deposition apparatus in accordance with the present invention.

Referring to FIG. 1, there is shown a vapor deposition apparatus 100 in accordance with the present invention. The vapor deposition apparatus 100 generally includes a vacuum chamber 1 subdivided by one or several dynamic locks 6a, 6b into a vapor deposition chamber 2, hereinafter referred to as the vapor deposition part, and a stripping chamber 7, hereinafter referred to as the chamber part. In the vapor deposition part 2 and in the chamber part 7, an endless belt 5 passes as a substrate. Onto this substrate 5, under a, vacuum of less than $10^{-3}$ mbar, there are sequentially vapor deposited from an evaporator 3 a water-soluble separating agent as a thin film having a thickness of approximately 5 to 100 nm, and then from further evaporators 4a, 4b, 4c the desired metals, oxides, and fluorides representing a product. The apparatus 100 may be operated with only slight: modifications both as a vapor deposition apparatus in accordance with a PVD process and in accordance with a sputtering or plasma enhanced chemical vapor deposition (PECVD) process.

In the chamber part 7, stripping the product from the substrate 5 takes place. The pressure conditions in the chamber part 7 are devised such that a vacuum of more than 4 mbar prevails. Under practical conditions, between 20 and 200 mbar are applied. Stripping under vacuum is considerably more favorable in terms of energy than the above-described stripping at environmental pressure because the sudden pressure changes between the stations are considerably smaller and less expenses need to be incurred for sealing the locks against each other.

To be more precise, dissolution of the separating agent in accordance with the invention takes place in water, implying the condition that a pressure which is sufficiently high above the water vapor pressure at the operating temperature must prevail in the chamber part 7. It should be noted that the higher the temperature of a solvent, the more rapid the dissolution of the vapor deposited separating agent: takes place. Trials have shown that most favorable conditions—under which the dissolution of the separating agent takes place at a sufficient rate and under which operation is still possible with only 2 locks 6a, 6b between the high vacuum range of the vapor deposition part 2 and the chamber part 7—are provided if the following requirements are met:

(1) Vacuum in chamber part 7: >53 mbar
(2) Water temperature: 35° C., corresponding to a vapor pressure of 53 mbar.

In the chamber part 7, the surface of a condenser 8 cooled to 4–25° C. causes generated water vapor to condense and flow back into the stripping station 9 in the chamber part 7. As an example, for vacuum conditions and pump sizes and types to be installed, the values shown in the table of FIG. 2 were determined for the passage of an endless belt of 600×0.4 mm and an open gap width above the substrate 5 of 0.2×600.2 mm for the reciprocating movement of the substrate 5 between the vapor deposition part 2 and the chamber part 7.

It would, of course, be possible to have the substrate 5, pass through further stages connected to the system and another positive pressure stage preventing the intake of dust from the atmosphere, from air to air, to there carry out stripping the product from the substrate 5. Such an apparatus is disclosed in a modified form in published patent application DE 4020999 as an endless belt unit and in GB 2072095 as an apparatus including several pressure stages along a large-size roll for transfer metallization of paper, or known from published patent application DE 2747061 purely as a substrate belt for metallization of a very thin plastic film placed thereon. Genuine air-to-air apparatuses without a substrate, namely for the metallization of plastic films, are described in EP 337369. In all of these apparatuses, substrate films and additional machines for preliminary and subsequent processing of the sheets must be used in producing pigment flakes. The expense of air-to-air apparatuses in terms of machinery is substantially higher due to additional lock stages in the range of 1000 to 50 mbar; their energy consumption for the vacuum pumps is therefore twice as high as that of the apparatus 100 according to the present invention.

The belt-type vapor deposition apparatus 100 of the present invention requires no more than two dynamic locks 6a, 6b in the range between $10^{-4}$ and 50 mbar. The vacuum conditions turn out to be even more favorable if, instead of water, secondary or tertiary alcohols are used as a solvent. This is under the condition of using separating agents that are well soluble in the named substances. Secondary and tertiary alcohols have a substantially lower vapor pressure than water and still lend themselves well to pumping at −5° C., corresponding to a vapor pressure of less than 0.01 mbar. It is preferred to use secondary or tertiary alcohols at more than 0.05 mbar. The locks 6a and 6b may therefore be omitted, and the chamber part 7 directly follows the vapor deposition part 2 while separated from it by a slot. The economic advantages of such a 2-chamber unit are, however, slight because there is a limited number of separating agents soluble and well vaporisable in secondary or tertiary alcohols, and these alcohols are harmful to the environment.

Also suited as solvents are, however, branched or linear primary alcohols, or mixtures of water, branched or linear primary alcohols, secondary alcohols and tertiary alcohols.

For the purpose of guiding the substrate 5 in the vacuum chamber 1, there are further provided a deflection roll 16 upstream of the evaporator 3 and the stripping station 9 in the chamber part 7. The stripping station 9 consists of a number of deflection rollers 10 each immersing the substrate 5 into a respective container 11a and 11b capable of being raised and lowered. For starting up the apparatus 100, or in the case of shutting-down operations, the first container 11a is raised in the running direction and serves as a stripping station for the product to be rejected until a time when stable conditions are present. Then, the container 11b serving as a collector for good material is raised, and the container 11a is lowered. Stripping the product and collecting it in the form of a suspension subsequently take place in the container 11b. For accelerating the dissolution of the separating agent, known processes using underwater high-pressure jets, ultrasonic vibrators or rotating brushes may be applied. The suspension of the product, water and dissolved separating agent is continuously evacuated from the bottom level of the container 11b and conveyed to the atmosphere by way of a water pump 12 and there pressed through one of two exchangeable filter 13a and 13b. The product is intermittently removed from these filters, repeatedly rinsed with clean water, dried, ground to the desired particle size, and then passed on to further processing into paint or printing ink production or to other uses.

Having emerged from the container 11b, the substrate 5 passes through a rinsing station 14 with water having the same temperature as the bath in the container 11b, and a wiping station 15 for residual water. The belt trajectory returns via the locks 6b and 6a into the vapor deposition part 2, wherein the substrate is then guided over the deflection roll 16 to the evaporator 3 for the separating agent and on to the evaporators 4a, 4b, 4c. Hereby the circuit is closed.

At this point it should be noted that residual humidity adhering to the substrate 5 is pumped off in the locks 6a and 6b.

Figure 3:
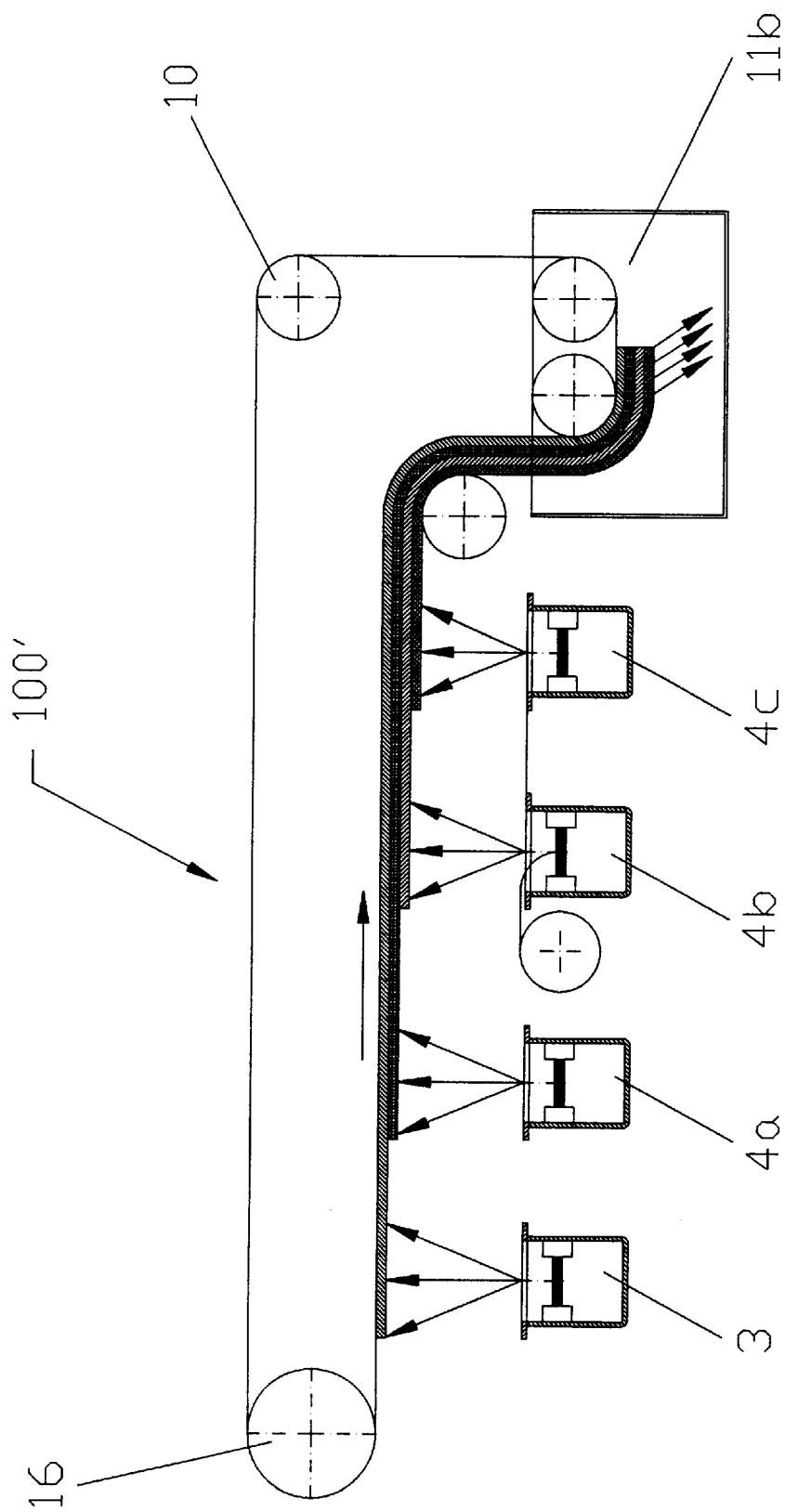
FIG. 3 illustrates how layer buildup and layer detachment occur in the course of one cycle of a substrate in the apparatus shown in FIG. 1 in accordance with the present invention.

Referring to FIG. 3, there is shown a more detailed view of the selected portions 100' of the apparatus 100 revealing how layer buildup and layer stripping occur in the course of one cycle of the substrate 5 in accordance with the present invention. The use of several different evaporators 4a, 4b, 4c along the running direction of the substrate 5 allows for the production of a wide variety of plane-parallel flakes and combinations thereof. Examples of such flakes, as well as some typical corresponding applications, are shown in the table of FIG. 4.

Both in the cases where only one evaporator is used and in the cases where several evaporators are employed, it is necessary to vapor deposit a separating agent soluble in water or alcohol as the first layer on the substrate 5, wherein the gsm typically is 0.05 to 0.1 g/m$^2$. Suitable separating agents which may be evaporated without decomposition, have little or no toxicity and are water-soluble are, for example: anhydrous sodium chloride, potassium chloride, lithium chloride, sodium fluoride, potassium fluoride, lithium fluoride, calcium fluoride, sodium aluminum fluoride (cryolite) and di-sodium tetraborate. Also found to be suitable as the separating agent were antimony trioxide, boron oxide, calcium iodide, cerium (III) iodide, lithium iodide, sodium iodide, yttrium iodide, lithium sulfate, potassium sulfate, sodium sulfate and other sulfates, sodium hydroxide, potassium hydroxide, yttrium bromide and other bromides.

For the operation of the vapor deposition apparatus 100 according to the present invention, the choice of the substrate belt 5 is of particular importance. The substrate belt 5 is to present a surface having a very small surface roughness, lend itself well to welding following introduction into the belt-type vapor deposition apparatus 100, and present very good chemical and mechanical strength. The following materials are suitable for the substrate belt 5: mirror-finish rolled or electropolished stainless steel, superalloys such as INCONEL™, INCOLOY™ etc., high-polished nickel, but also electroplated metals, wherein the coating determines the resistance to chemical attack as well as the surface quality, and the backing material determines the desired strength. Metallic substrates comprising organic coatings of pigmented or unpigmented paints of hard and chemically resistant thermoset and thermoplastic materials are also suitable for the substrate belt 5. When relinquishing the substantially longer lifetime of metallic substrates, polyimide film substrates such as, e.g., KAPTON™, which permanently resistant up to 200° C. under vacuum are also suitable for the substrate belt 5.

The thickness of the substrate belt 5 has a bearing on the diameters of the deflection rolls utilized in the belt-type vapor deposition apparatus 100. At an expected service life of 10$^6$ cycles, about 10 million bending deformations are to be assumed. The fatigue strength of the material, the thickness of the substrate belt 5 and the diameters of the rolls must herein be adapted to each other. As commercially offered qualities of steel or nickel belts having the required low surface roughness are available only above 0.2 mm thickness, there result typical roll diameters of about 250 mm or 500 mm for film thicknesses of 0.2 mm and 0.4 mm, respectively.

The choice of substrate thickness results in another compromise: particularly in cases of multi-layer vapor depositions, the substrate 5 is strained by condensation heat and heat radiation originating in the evaporator sources, with no intermediate cooling of the substrate 5 by cooled rolls being provided. Calculations and measurements have shown that owing to the good infrared reflection of a mirror-finish substrate and also of most vapor deposited metal layers, about 70 to 85% of incident energy is reflected. Moreover metal belts, other than plastic films, may heat up to 180° C. under vacuum during passage, whereas plastic materials already outgas at 60° C. to such a degree that vacuum breakdown may take place in the evaporation range.

The effects of this circumstance are illustrated by the following comparison showing the ratio of thermal resistance of various substrate materials having typical thicknesses. What is decisive in heating the substrate 5 is the ratio of:

$$(1/(c_p \times \rho \times d)_{metal})/(1/(c_p \times \rho \times d)_{plastic})$$

This ratio is about 1/66 for 400 μm of metal and 12 μm of plastic. This means, under otherwise identical conditions, that the metal belt only heats up by 1.5% in comparison with the plastic. At the same time, a metal belt allows for admissible heating which is higher by the following factor:

$$f=(180-20)/(60-20)=4$$

The metal belt may also absorb a 4×66=264-fold amount of heat in comparison with the plastic film before reaching the thermal endurance limit. Heat build-up due to the repeating cycle of the substrate 5 does not take place as it is cooled to 35° C. by the liquid bath in the stripping station 9 during every cycle. This useful side effect avoids the use of internally cooled rolls.

Combining the ends of the substrate belt 5 following its introduction into the apparatus 100 is achieved by butt-welding, without thickening of the belt at the welding joint, as the vacuum locks only allow for a small distance from stationary parts. Of importance in routing the substrate belt 5 is the trajectory of the substrate belt 5 shown in FIG. 1: following vapor coating of the substrate 5, the substrate belt 5 is passed through all of the locks free of contact on the vapor deposition side, in order to avoid damage to the vapor deposited layers.

The above-described belt-type vapor deposition apparatus 100 permits technical displacement velocities of up to 350 m/min, wherein, however, synchronous behavior of all the stages is required. The vapor deposition rates must be adapted correspondingly to the desired layer thicknesses by means of suitable control mechanisms known per se.

Layer thickness measurement systems, whereby the layer thickness produced by each evaporator may be measured andc controlled over very long periods in the order of days, are disclosed in DE 4338907.

The stripping station 9 must be designed such that the product is completely stripped from the substrate 5 even at maximum displacement velocities. As this station 9 is operated at a vacuum of no more than about 50 mbar, adaptation through increasing the chamber length and the pumping capacity is possible at moderate costs.

Continuous operation of the apparatus 100 is possible over periods of several days up until the time when maintenance and cleaning of the evaporators requires an interruption. This necessitates the use of continuously chargeable evaporators having a construction known per se.

As an example of the capacity of the belt-type vapor de position apparatus 100 according to the present invention having a substrate width of 600 mm and a displacement velocity of 300 m/min, the calculated amount of plane-parallel flakes of aluminum produced per hour is sufficient for spray-painting 108 automobiles each having 25 m$^2$ of surface to be painted with a metallic paint, wherein a 4-layer cover of flakes is provided.

The above-described embodiments for the apparatus 100 and the process may be modified as follows:

It is possible to install additional separating agent evaporators each downstream of a product evaporator. Thus, it is possible to detach several layers of a product per substrate cycle. As a result, the capacity of the apparatus 100 may be multiplied.

As an alternative, or in addition to the above-specified variant, the use of different surface structures of the substrate 5 makes it possible to influence the degree of gloss of the product.

The present invention thus relates to a multi-chamber apparatus for producing layers vapor deposited in vacuum on an endlessly circulating substrate, including the following sequential steps: vapor deposition of a separating agent in high vacuum; vapor deposition of one or several layers of metal, oxides, fluorides, nitrides in high vacuum; stripping the vapor deposited layers from the endless substrate under low vacuum. The vapor deposited layers are subsequently present in a separate vacuum stage separated from the vapor deposition chamber by dynamic locks as a suspension of fine flakes in a mixture of solvent and separating agent. The suspension may continuously or intermittently be transferred out of the separate vacuum stage for further processing. The solvent may be water in a vacuum environment of more than 20 mmbar or secondary or tertiary alcohols at more than 0.05 mbar.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for producing plane-parallel flakes, the method comprising the steps of:
   (a) providing a lower than atmospheric pressure chamber;
   (b) within said chamber, physical vapor deposition of a separating agent on an endless substrate at a pressure lower than atmospheric pressure for producing a separating agent layer on the endless substrate;
   (c) thereafter within said chamber, physical vapor deposition of at least one layer on the separating agent layer at a pressure lower than atmospheric pressure; and
   (d) thereafter within said chamber, dissolution of the separating agent layer in a solvent so as to produce a suspension wherein the at least one layer is present in the form of plane-parallel flakes;
   wherein step (d) is carried out at a pressure which is higher than the pressure in steps (b) and (c) and lower than atmospheric pressure and the substrate is not exposed to atmospheric pressure throughout steps (b), (c) and (d).

2. The method according to claim 1, wherein the separating agent is a first separating agent, wherein the separating agent layer is a first separating agent layer, and wherein, step (c) includes the substeps of:
   vapor deposition of a first layer on the first separating agent layer;
   vapor deposition of a second separating agent on the first layer to produce a second separating agent layer; and
   vapor deposition of a second layer on the second separating agent layer;
   wherein the first and the second layers are present in the suspension produced in step d.

3. The method according to claim 1, wherein the solvent comprises water, the separating agent is a water-soluble substance vaporizable in a high vacuum pressure of less than $10^{-3}$ mbar without decomposition, and at least one layer comprises metal and another vaporizable substance.

4. The method according to claim 1, wherein the substrate is fabricated of materials selected from the group consisting of a stainless steel alloy, nickel, a metal having an electroplated surface of greater chemical resistance than said metal, a metal having a chemically resistive organic coating, and a polyimide film.

5. The method of claim 1 in which said method comprises a continuous process with said endless substrate operating to rotate in a closed-loop path with substantially continuous motion and continuous subatmospheric pressure as a continuous process, using a pair of dynamically pumped vacuum chamber volumes through which said endless substrate extends, said chamber volumes being at different pressures for a respectively performing steps (b) and (c), and then step (d) at said different pressure.

6. The method of claim 1 in which said solvent is selected from the group consisting of secondary and tertiary alcohols, and the vacuum pressure of step (d) is between 0.05 mbar and 20 mbar.

7. The method of claim 1 in which the vacuum pressure of step (d) is more than 20 mbar and said dissolution takes place with water as said solvent.

8. A method for producing plane-parallel flakes, the method comprising the steps of:
   (a) providing a lower than atmospheric pressure chamber;
   (b) within said chamber, physical vapor depositing a separating agent on an endless substrate at a vacuum pressure of less than $10^{-3}$ mbar, to produce a separating agent layer on said endless substrate;
   (c) thereafter within said chamber, physical vapor depositing at least one layer of flake-forming material on the separating agent layer at a vacuum pressure less than $10^{-3}$ mbar;
   (d) thereafter within said chamber, dissolving of the separating agent layer in a solvent so as to produce a suspension of the flake-forming layer in the form of plane-parallel flakes in said solvent at a pressure lower than atmospheric pressure but greater than $10^{-3}$ mbar;
   wherein the substrate is not exposed to atmospheric pressure throughout steps (b), (c) and (d).

9. The method of claim 8 in which the pressure used in step (d) is more than four mbar.

10. The method of claim 9 in which the pressure used in step (d) is between 20 and 200 mbar.

11. The method of claim 8 in which said method comprises a continuous process with said endless substrate operating to rotate in a closed-loop path with substantially continuous motion, using dynamically pumped vacuum chamber volumes through which said endless substrate extends, said chamber volumes being at different pressures for respectively performing steps (b) and (c), and then step (d) at said different pressure.

12. The method of claim 11 in which the pressure used in step (d) is more than four mbar.

13. The method of claim 12 in which the pressure used in step (d) is between 20 and 200 mbar.

14. The method of claim 8 in which said method comprises a continuous process with said endless substrate operating to rotate in a closed-loop path with substantially continuous motion and continuous subatmospheric pressure as a continuous process, using a pair of dynamically pumped vacuum chamber volumes through which said endless substrate extends, said chamber volumes being at different pressures for respectively performing steps (b) and (c), and then step (d) at said different pressure.

15. The method of claim 14 in which the subatmospheric pressure used in step (d) is more than four mbar.

16. The method of claim 14 in which the pressure used in step (d) is between 20 and 200 mbar.

17. The method of claim 8 in which the pressure used in step (d) is between 20 and 200 mbar and the dissolution takes place with water as a solvent.

18. The method of claim 8 in which said solvent is selected from the group consisting of secondary and tertiary alcohols, and the vacuum pressure of step (d) is between 0.05 mbar and 20 mbar.

* * * * *

UNITED STATES PATENT AND TRADEMARK OFFICE
CERTIFICATE OF CORRECTION

PATENT NO.    : 6,270,840 B1
DATED         : August 7, 2001
INVENTOR(S)   : Himlar H. Weinert It is certified that error appears in the above-identified patent and that said Letters Patent is hereby corrected as shown below:

Colum 1,
Line 40, "oil" should be -- on --.

Column 3,
Line 10, delete ",";
Line 36, "wherebr" should be -- whereby --;
Line 55, delete ";";
Line 67, delete ".".

Column 5,
Line 25, delete ";".

Column 8,
Line 30, "andc" should be -- and --.

Signed and Sealed this

Fourth Day of June, 2002

Attest:

Attesting Officer

JAMES E. ROGAN
Director of the United States Patent and Trademark Office